United States Patent [19]

Ogura et al.

[11] Patent Number: 4,748,596
[45] Date of Patent: May 31, 1988

[54] SEMICONDUCTOR MEMORY DEVICE WITH SENSE AMPLIFIERS

[75] Inventors: Mitsugi Ogura; Yasuo Itoh, both of Yokohama, Japan

[73] Assignee: Kabushika Kaisha Toshiba, Kawasaki, Japan

[21] Appl. No.: 792,197

[22] Filed: Oct. 28, 1985

[30] Foreign Application Priority Data

Dec. 13, 1984 [JP] Japan ................................ 59-263301

[51] Int. Cl.[4] .............................................. G11C 7/00
[52] U.S. Cl. .................................... 365/205; 365/207; 365/149
[58] Field of Search ............... 365/149, 189, 205, 207, 365/210, 203

[56] References Cited

U.S. PATENT DOCUMENTS

| | | | |
|---|---|---|---|
| 4,298,867 | 11/1981 | Craig | 340/728 |
| 4,331,955 | 5/1982 | Hansen | 340/728 |
| 4,386,349 | 5/1983 | Granberg et al. | 340/723 |
| 4,491,858 | 1/1985 | Kawamoto | 365/149 X |
| 4,506,351 | 3/1985 | Scheuerlein et al. | 365/205 |

FOREIGN PATENT DOCUMENTS

| | | |
|---|---|---|
| 0100872 | 2/1984 | European Pat. Off. |
| 2435794 | 3/1975 | Fed. Rep. of Germany |
| 3137386 | 8/1982 | Fed. Rep. of Germany |
| 48207 | 7/1982 | Japan ................................ 365/210 |

OTHER PUBLICATIONS

J. M. Lee, J. R. Breivogel, R. Kunita, C. Webb, ISSCC 79 Digest of Technical Papers, pp. 142–143; 1979.

Primary Examiner—Joseph A. Popek
Attorney, Agent, or Firm—Oblon, Fisher, Spivak, McClelland & Maier

[57] ABSTRACT

In a dynamic semiconductor memory, bit line pairs and word lines are perpendicular to each other and arranged in a matrix constituted by memory cells. Dummy cells are arranged at intersections between the bit line pairs and a pair of dummy cell word lines. The capacitance of each dummy cell is half that of the memory cell. A pre-sense amplifier and a main sense amplifier are arranged in each pair of bit lines. When data is read out from a selected memory cell, the pre-sense amplifiers are simultaneously activated to perform the pre-sensing operation. However, in the main sensing operation, only one specific main sense amplifier arranged in a certain bit line pair including the bit line connected to the selected memory cell is activated.

10 Claims, 2 Drawing Sheets

SEMICONDUCTOR MEMORY DEVICE WITH SENSE AMPLIFIERS

BACKGROUND OF THE INVENTION

The present invention relates to a semiconductor memory device and, more particularly, to a dynamic or programmable random access memory.

Various types of programmable semiconductor memory devices have become commercially available in recent years. Among these devices, a dynamic random access memory (dRAM) having memory cells each consisting of one MOSFET and one MOS capacitor, has been a major memory product due to its high packing density.

In a conventional dRAM, memory cells are formed at cross points between a plurality of bit line pairs and word lines. The intersections between the bit and word lines have dummy cells which receive a dummy cell write clock signal through a dummy cell clock line. Sense amplifiers are arranged at the bit line pairs and are used on the order of 1,000 units in a conventional dRAM. The sense amplifiers are connected by a common line to first and second MOSFETs which are connected in parallel with each other and have different transconductances. The first MOSFET receives a pre-sensing clock signal, and the second MOSFET receives a main sensing clock signal. In the pre-sensing mode, the first MOSFET is rendered conductive. In the main sensing mode, the second MOSFET is rendered conductive. The sense amplifiers are activated in a two-step manner in the pre-sensing and main sensing modes upon selective switching of the first and second MOSFETs. More specifically, when the first MOSFET is rendered conductive, all the sense amplifiers are simultaneously activated and perform pre-sensing. Similarly, when the second MOSFET is rendered conductive, all the sense amplifiers are simultaneously activated to perform main sensing. This sense amplifier drive scheme is well known as a "multi-grounded method" to those skilled in the art.

In a data read/write mode, the sense amplifiers arranged at the bit line pairs are driven by the multi-grounded method and perform pre-sensing and main sensing operations. In this case, all the sense amplifiers are simultaneously activated in each sensing mode. Therefore, the bit lines connected to all the sense amplifiers are simultaneously discharged. When discharge occurs for a short period of time, a peak current increases and causes variations in ground voltage Vss. Variations in ground voltage Vss cause internal noise in the memory, thereby degrading reliability of the data read/write operation.

SUMMARY OF THE INVENTION

It is therefore an object of the present invention to provide a new and improved semiconductor memory device for improving reliability of data write/read access.

In the semiconductor memory device of the present invention, a plurality of bit line pairs are formed on a substrate and are parallel with each other. A plurality of first word lines and a pair of second word lines extend to be substantially perpendicular to the bit line pairs. Memory cells are formed in a matrix at intersections between the bit lines and the first word lines. Each memory cell has a memory cell transistor and a memory cell capacitor. Dummy cells are formed at cross points between the bit lines and a pair of second word lines. Each dummy cell comprises a dummy cell transistor and a dummy cell capacitor. Each dummy cell capacitor has a capacitance half that of each memory cell capacitor. A plurality of sense amplifier units are connected to the bit lines. In the data read mode, the dummy cell capacitors are precharged to a first voltage defining a first logic level. In this case, all the bit lines are precharged at a second voltage defining a second logic level higher than the first logic level. In the pre-sensing mode, the bit lines are electrically floating. A driver unit is connected to the sense amplifier units. The driver unit simultaneously activates the sense amplifier units in the data readout mode, while the specific bit line pair including the specific bit lines connected to the selected memory cell are designated, so that pre-sensing is performed. Therefore, a potential difference between the specific bit line connected to the selected memory cell and the bit line paired with this bit line and connected to the dummy cell is gradually amplified. The driver unit activates only the sense amplifier unit connected to the specific bit line pair, and the potential difference in the specific bit line pair is adjusted to be substantially equal to the potential difference between the first and second voltages. The data (high or low level logic data) is read out from the selected memory cell.

BRIEF DESCRIPTION OF THE DRAWINGS

The present invention is best understood by reference to the accompanying drawings, in which.

DETAILED DESCRIPTION OF THE PREFERRED EMBODIMENT

Figure 1:
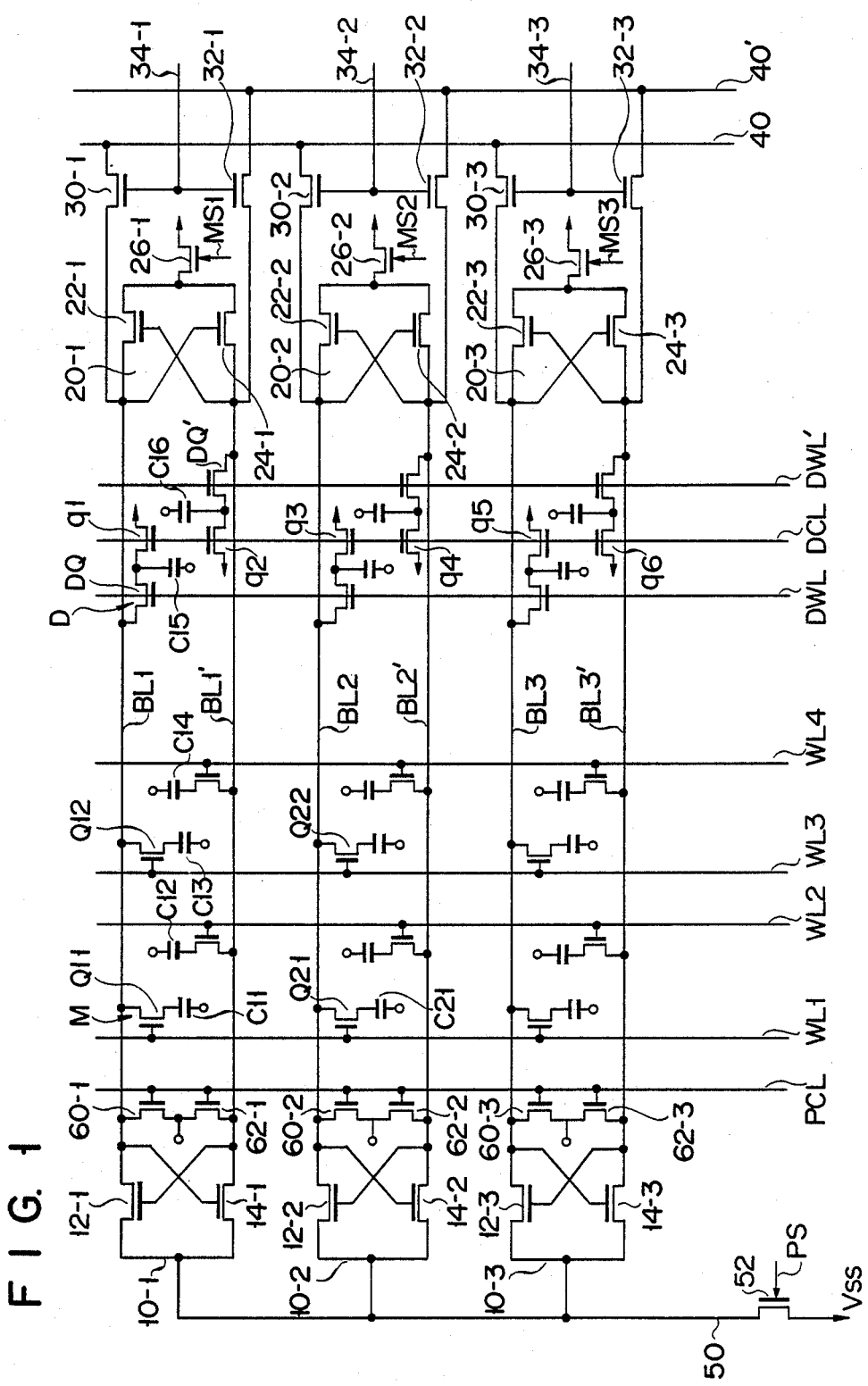
FIG. 1 is a circuit diagram showing the main wiring configuration of a dynamic random access memory (dRAM) according to a preferred embodiment of the present invention.

The chip substrate is not illustrated in FIG. 1 for the sake of simplicity. The substrate is outlined by dotted lines. A plurality of row address lines (hereinafter referred to as "bit lines") BLi and BLi' extend on the chip substrate along the row direction. Memory cell column address lines (hereinafter referred to as "memory cell word lines") WL1, WL2, WL3, WL4, . . . extend perpendicularly to the bit lines BL (or, in the column direction). The word lines WL are stacked on the bit lines BL and are electrically insulated therefrom. Memory cells M are formed at the cross points between the bit lines BL and BL' and the word line WL. Therefore, the memory cells are formed on the substrate in a matrix form.

Each memory cell consists of one MOSFET Q and one MOS capacitor C. The drains of the MOSFETs Q, which are included in the memory cells M connected to one bit line (e.g., BL1), are commonly connected to the bit line BL1. Similarly, the drains of the MOSFETs Q included in the row cells are connected to a bit line BL1'. Each word line WL is electrically connected to the gates of the MOSFETs of the corresponding memory cell array extending along the column direction (vertical direction in FIG. 1). Therefore, when one bit line BL (or BL') and one word line WL are activated, a desired cell may be selected. At this time, the MOSFET of the selected cell is rendered conductive, and the MOS capacitor connected to the MOSFET accumulates an electrical charge, i.e. data. Hence, the cell stores the data.

A pair of dummy word lines DWL and DWL' run parallel to the word lines WL and cross the plurality of bit lines BL and BL'. Dummy cells D are provided at the cross points between the bit lines BL and BL' and the dummy word lines DWL and DWL'. Each dummy cell D comprises one MOSFET Q and one MOS capacitor C, like the memory cell M. The capacitance of the dummy cell capacitor is half that of the memory cell capacitor. The source of the MOSFET DQ included in each dummy cell D is connected to another MOSFET q. Therefore, the MOSFETS q1, q2, q3, q4, q5, . . . of the dummy cells are arranged along the column direction as shown in FIG. 1. A line (dummy cell write clock line) DCL for supplying a write clock to the dummy cells D is arranged parallel to the lines DWL and DWL', thus connecting the gates of the MOSFETs q. In a dummy cell, when the MOSFET q is rendered conductive, the ground voltage Vss is applied to the source of the corresponding MOSFET DQ since the MOSFET q is grounded at one end.

Pre-sense amplifiers 10-1, 10-2, 10-3, . . . and main sense amplifiers 20-1, 20-2, 20-3, . . . are connected to the plurality of bit line pairs (BL and BL'). More specifically, the amplifiers 10-1 and 20-1 are connected to the lines BL1 and BL1'. The amplifier 10 performs only pre-sensing, and the amplifier 20 performs main sensing. The lines BL1, BL2, BL3, . . . are connected to a first input/output line 40 through MOSFETs 30-1, 30-2, 30-3, . . . . The lines BL1', BL2', BL3', . . . are connected to a second input/output line 40' through MOSFETs 32-1, 32-2, 32-3, . . . . The gates of the MOSFETs 30 and 32 connected to each pair of bit lines BL and BL' are connected to each other and to row select lines 34-1, 34-2, 34-3, . . . for transmitting the row select signal.

Each pre-sense amplifier 10-1 (i=1, 2, 3, . . . ) has two MOSFETs 12-i and 14-i connected in series with the bit lines BLi and BLi'. Here, "i" is the number of each bit line, and will be used for the number of identical elements. Where it is not necessary to distinguish between the bit numbers, "i" will not be used. In each pre-sense amplifier 10, the gate of one MOSFET is connected to the source of the other MOSFET. The drains of these MOSFETs 12 and 14 are connected to each other and to a single common active line 50. The drains of the MOSFETs 12-1, 12-2, 12-3, . . . included in the amplifiers 10-1, 10-2, 10-3, . . . and the drains of the MOSFETs 14-1, 14-2, 14-3, . . . are connected to the line 50. The line 50 is connected to the ground voltage Vss (i.e., a voltage defining the logic low level) by a MOSFET 52. A pre-sensing clock signal PS is supplied to the gate of the MOSFET 52. The MOSFET 52 performs switching operation in response to the signal PS. The MOSFET 52 has a transconductance smaller than that of MOSFETs 26 (described later). When the line 50 is pre-charged to the source voltage Vcc and the FET 52 is rendered conductive, the potential in the line 50 slowly changes toward the ground voltage Vss).

Two MOSFETs 60 and 62 are arranged in series with each other between each pair of bit lines BL and BL'. The gates of all MOSFETs 60-1, 60-2, 60-3, . . . and 62-1, 62-2, 62-3, . . . are connected to a pre-charge line PCL to which the pre-charging clock signal is transferred. When the potential at the line PCL is set at the power source potential Vcc (i.e., a voltage defining the logic high level), the MOSFETs 60 and 62 are simultaneously rendered conductive, and all MOSFETs 60 and 62 are precharged.

Each main sense amplifier 20-i has two MOSFETs 22-i and 24-i respectively connected in series with the corresponding bit lines BLi and BLi'. In each main sense amplifier 20-i, the gate of one MOSFET is connected to the source of the other MOSFET. The drains of the MOSFETs 22-i and 24-i are connected to each other and to the ground potential Vss by the switching MOSFET 26 for activating the main sense amplifier. The main-sensing clock signals are supplied to the gates of the MOSFETs 26-1, 26-2, 26-3, . . . , respectively. It should be noted that the trans-conductance of the MOSFETs 26 is larger than that of the MOSFET 52.

Figure 2A:
FIGS. 2A to 2P are respectively diagrams showing main signals generated in the main part of the circuit of FIG. 1 in the data readout mode.

The operation mode of the dRAM having the structure described above will be described hereinafter. In the data readout mode, the pre-charging clock signal having a waveform of FIG. 2A is supplied to the line PCL. For a predetermined period of time, the potential at the line PCL is set at logic "high" level (e.g., the power source voltage Vcc+the threshold voltage Vth). All MOSFETs 60 and 62 are simultaneously rendered conductive. As a result, all the bit lines BL and BL' are precharged to the source voltage Vcc.

Figure 2B:
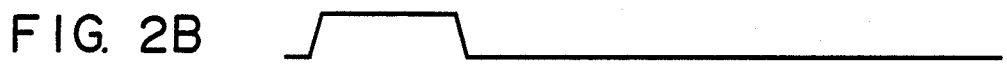

The dummy cell write clock signal having the waveform of FIG. 2B is supplied to the line DCL simultaneously when the pre-charging signal (FIG. 2A) is supplied. The potential of the dummy cell write clock signal goes to logic "high" level in synchronism with transition of the pre-charging clock signal of FIG. 2A. In response to transition of the dummy cell write clock signal to logic "high" level, the MOSFETs q1, q2, q3, . . . are simultaneously rendered conductive. Voltage data of logic "low" level (e.g., the ground potential Vss) is written in all dummy cells D. The clock signals respectively supplied to the lines PCL and DCL are set at logic "low" level, as shown in FIGS. 2A and 2B, before the memory is set in the active condition.

Figure 2C:
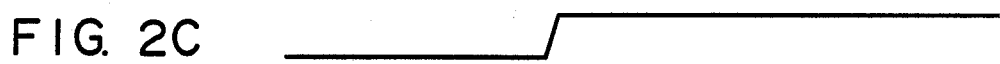
Figure 2D:
Figure 2E:
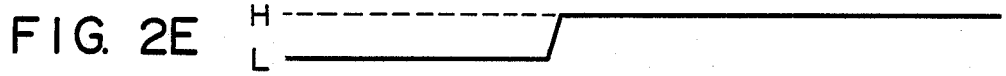
Figure 2F:

When the bit line pre-charging clock signal (FIG. 2A) supplied to the line PCL and the dummy cell write clock signal (FIG. 2B) supplied to the line DCL are set at logic "low" level, all bit lines BL and BL' are electrically floating. Thereafter, the memory is set in the active state. At the same time, a select signal having the waveform of FIG. 2C is supplied to the word line WL, e.g., the word line WL1, while non-select signals normally having low level (FIG. 2D) are supplied to other lines WL2, . . . . Upon such word line selection, a potential at line WL1 is set at logic "high" level (e.g., a voltage higher than a voltage sum of the power source voltage Vcc+the threshold voltage Vth). At the same time, the potential at the dummy cell word line DWL' is set at logic "high" level, as shown in FIG. 2E (meanwhile, the potential at other lines DWL is kept unchanged at logic "low" level, as shown in FIG. 2F). The FETs Q11 and DQ' are rendered conductive. As a result, a potential corresponding to the data of the capacitor C11 appears on the line BL1. A potential corresponding to the data of the capacitor C16 appears on the line BL1'. A potential difference occurs between the bit lines BL1 and BL1', since the capacitance of the dummy cell capacitor is half that of the memory cell, as described above. Even if the same logic level data are stored in these cells, a readout voltage of the capacitor C16 is half that of the capacitor C11 (i.e., a range of the readout voltage of the dummy cell capacitor is half that of the memory cell capacitor). A potential difference between the lines BL1 and BL1' is the input voltage to the amplifiers 10-1 and 20-1 connected thereto.

Figure 2G:
Figure 2H:
Figure 2I:
Figure 2J:
Figure 2K:
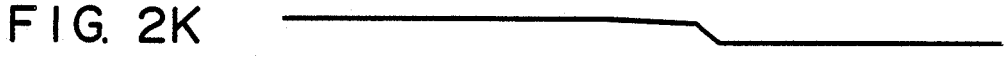
Figure 2L:

Subsequently, the potential of the signal PS is set at logic "high" level, as shown in FIG. 2G. The MOSFET 52 is rendered conductive in response to the signal PS of high level. The potential at the line 50 gradually falls (See FIG. 2K), and the voltage difference between the bit lines BL1 and BL1' is amplified by the corresponding amplifier 10-1. The pre-sensing operation is gradually performed since the transconductance of the FET 52 is relatively small. FIG. 2L shows the voltage drop at the pair of bit lines BL1 and BL1'. Potential changes of the bit lines BL1 and BL1' are indicated by the broken and solid lines. As is apparent from FIG. 2L, the potential at the line BL1' (logic "low" level) is lowered, while the potential at the line BL1 (logic "high" level) is substantially unchanged. As a result, a potential difference between the bit line pair increases.

When the potential difference between the bit lines BL1 and BL1' properly increases, a main sensing clock signal MS1 having a logic "high" level (FIG. 2H) is supplied to only the amplifier 20-1 arranged in the bit lines BL1 and BL1'. The signal MS1 is supplied to the gate of the FET 26-1. In this case, the FET 26-1 is rendered conductive, so that only the amplifier 20-1 arranged in the selected bit line pair can be activated. Meanwhile, the gate potentials at the FETs 26-2, 26-3, . . . connected to the nonselected amplifiers 20-2, 20-3, . . . are kept at logic "low" level, as shown in FIGS. 2I and 2J, respectively.

Figure 2M:
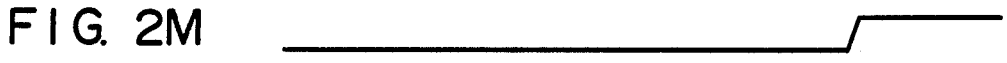
Figure 2N:
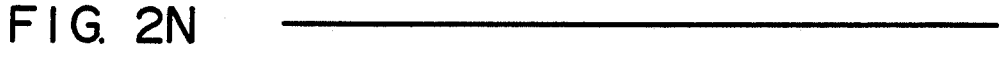
Figure 2O:
Figure 2P:

The logic high level potential, which the line BL1 or BL1' has upon activation of the amplifier 20-1, is kept at the source voltage Vcc, while the other line potential of logic low level falls to the ground potential Vss and is latched thereat. In this case, when a row select signal having logic "high" level (FIG. 2M) is supplied to a row select line 34, the FETs 30-1 and 32-1 are rendered conductive. (The potentials at the row select lines 34-2, 34-3, . . . connected to the nonselected amplifiers 20-1, 20-3, . . . are kept at logic low level, as shown in FIGS. 2N and 2O.) Therefore, the voltage corresponding to the latched potential difference between the selected bit lines BL1 and BL1' is applied to the input/output lines 40 and 40' through the FETs 30-1 and 32-1. As a result, the pieces of data readout from the selected bit lines BL1 and BL1' are supplied to the lines 40 and 40'. Potentials at the lines 40 and 40' change as shown in FIG. 2P. The voltage corresponding to the data stored in the selected capacitor C11 appears on the line 40, whereby the data is readout.

According to the dRAM of the embodiment described above, the pre-sense and main sense amplifiers 10 and 20 are independently provided for each bit line pair (BL1 and BL1'). According to the dRAM of this embodiment, only the amplifier 20 connected to the selected bit line pair is activated in the main sensing mode. The amplifiers 20 connected to the nonselected bit line pairs are not activated. Therefore, the remaining bit line pairs will not be discharged. Only the bit line pair connected to the selected amplifier 20 is discharged to read the data. Therefore, unlike the conventional dRAM, the peak current will not increase. Since the peak current can be suppressed in the main sensing mode, the ground potential can be effectively prevented from varying, and the peripheral circuit can thus be prevented from making errors. Therefore, the operating reliability of the dRAM can be improved.

Although the present invention has been shown and described with reference to particular embodiments, various changes and modifications which are obvious to a person skilled in the art are deemed to lie within the scope of the invention.

In the above embodiment, the amplifiers 10 and 20 are separately arranged for each bit line pair so as to perform pre-sensing and main sensing. However, the gist of the present invention is to prevent simultaneous activations of all main sensing amplifiers in the main sensing mode. Therefore, the present invention can apply to other arrangements, provided such simultaneous activations are prevented. The present invention can be realized even if one sense amplifier is arranged for each bit line pair as in the conventional dRAM. In this case, only the sense amplifier connected to the bit line pair is activated in response to the row select signal CSi in the main sensing mode. (The sensing amplifier connected to each bit line pair is activated in a twin-stage manner as in a conventional dRAM.) However, in the main sensing mode, all the sense amplifiers are not activated; only the selected sense amplifiers are activated. According to this modification, since only one sense amplifier is arranged for each bit line pair, the overall circuit configuration can be simplified.

What is claimed is:

1. A dynamic semiconductor memory device comprising:
   parallel bit line pairs formed on a substrate;
   first word lines extending substantially perpendicularly to said bit line pairs;
   a pair of second word lines extending substantially perpendicularly to said bit line pairs;
   memory cells formed at intersections between said bit line pairs and said first word lines and arranged in a matrix form;
   dummy cells formed at intersections between said bit line pairs and said second word lines;
   first sense amplifiers connected to said bit line pairs for performing a pre-sensing operation such that a potential difference between a specific bit line pair consisting of a bit line connected to a selected memory cell and a bit line connected to a dummy cell corresponding to the selected memory cell is detected and gradually amplified in a data readout mode for reading out data from the selected memory cell;
   second sense amplifiers connected to said bit line pairs, for performing a main sensing operation such that said potential difference of said specific bit line pair is further amplified in the data readout mode; and
   driver means connected to said first and second sense amplifiers for activating said first sense amplifiers simultaneously to perform the pre-sensing operation, and for then activating a selected one of said second sense amplifiers which is connected to said specific bit line pair to perform the main sensing operation, thereby reading out the data from the selected memory cell.

2. The device according to claim 1, wherein each of said memory cells includes a memory cell transistor and a memory cell capacitor, and wherein each of said dummy cells includes a dummy cell transistor and a dummy cell capacitor having a capacitance half that of said memory cell capacitor, each of said dummy cell capacitors being charged with a first voltage defining a first logic level upon precharging.

3. The device according to claim 2, further comprising:
bit line pre-charging means, connected to each of said bit line pairs, for, in the data readout mode, pre-charging said bit line pairs and applying a second voltage which defines a second logic level and which is higher than the first logic level, and for, in a pre-sensing mode, electrically floating said bit lines.

4. The device according to claim 3, wherein said driver means activates said first sense amplifiers simultaneously to perform the pre-sensing operation and hence gradually amplifies the potential difference generated between the specific bit line pair, and thereafter activates only one of said second sense amplifiers connected to said specific bit line pair to perform the main-sensing operation and hence increases the potential difference between said specific bit line pair to be substantially equal to a potential difference between the first and second voltages, thereby reading out the data from the selected memory cell.

5. The device according to claim 3, wherein said driver means comprises:
a first switching transistor, commonly connected to said first sense amplifiers, for receiving a pre-sensing clock signal to be conductive in response to the pre-sensing clock signal and for simultaneously supplying the first voltage to said first sense amplifiers.

6. The device according to claim 5, wherein said driver means comprises:
second switching transistors, connected to said second sense amplifiers, for receiving main sensing clock signals, respectively, said second switching transistors including a second switching transistor, connected to said specific bit line pair, for receiving the main sensing clock signal to be conductive in response to the main sensing clock signal and for supplying the first voltage only to said sense amplifier connected to said specific bit line pair.

7. The device according to claim 6, wherein said first switching transistor has a transconductance smaller than that of each of said second switching transistors.

8. The device according to claim 7, wherein said bit line pairs have first and second ends, said first sense amplifiers being connected to the first ends, and said second sense amplifiers being connected to the second ends.

9. The device according to claim 8, further comprising:
a pair of input/output lines connected to said second ends of said plurality of bit line pairs.

10. The device according to claim 9, wherein the first voltage is a ground voltage, and the second voltage is a power source voltage.

* * * * *